United States Patent

Hayakawa et al.

[11] Patent Number: 5,395,260
[45] Date of Patent: Mar. 7, 1995

[54] IC SOCKET

[75] Inventors: Nanahiro Hayakawa, Tokyo; Hideki Sagano, Kawasaki, both of Japan

[73] Assignee: Yamaichi Electronics Co., Ltd., Tokyo, Japan

[21] Appl. No.: 174,369

[22] Filed: Dec. 28, 1993

[30] Foreign Application Priority Data

Dec. 28, 1992 [JP] Japan .................. 4-359866

[51] Int. Cl.⁶ .......................... H01R 13/629
[52] U.S. Cl. .................. 439/266; 439/331; 439/73; 439/382
[58] Field of Search ............ 439/68, 70–73, 439/263, 264, 330, 331, 382, 525, 526, 266

[56] References Cited

U.S. PATENT DOCUMENTS

| 3,380,016 | 4/1968 | Samson et al. | 439/382 |
| 4,766,371 | 8/1988 | Moriya | 439/68 X |
| 4,878,846 | 11/1989 | Schroeder | 439/73 X |
| 5,261,832 | 11/1993 | Uratsuji et al. | 439/266 |

FOREIGN PATENT DOCUMENTS

| 63-62175 | 3/1988 | Japan . |
| 2130383 | 5/1984 | United Kingdom | 439/68 |

Primary Examiner—Steven C. Bishop
Attorney, Agent, or Firm—Wenderoth, Lind & Ponack

[57] ABSTRACT

An IC socket has a plurality of contacts arranged so as to be subjected to pressing contact with terminal members of an IC package loaded on an IC loading portion. An elastic sheet, whose base material itself has compressibility and restorability, is disposed on the IC loading portion. The IC package loaded on the IC loading portion is supported on the elastic sheet.

3 Claims, 2 Drawing Sheets

IC SOCKET

BACKGROUND OF THE INVENTION

1. Field of the Invention

This invention relates to an IC socket in which contacts mounted on the socket body are brought into pressing contact with terminal members of an IC package due to stored resilient force thereof.

2. Brief Description of the Prior Art

In the official Gazette of Japanese Early Laid-Open Patent Application No. Sho 63-62175, there is disclosed an IC socket in which a contact arm extending from an upper end of a curved spring element of each contact is displaced rearwardly and downwardly to release the contact between the contacts and terminal members of an IC package by lowering a contact shutter member. When the contact arm is displaced forwardly and upwardly, the contacts accumulate or store resilient force and are brought into pressing contact with the terminal members by the resilient force thus stored.

Recently, with the progress of high integration and high density, in electric parts such as IC packages, the width and the thickness of their terminal members have been gradually reduced. This brings about the tendency that the contacting force between the contacts and the terminal members is reduced. Therefore, if vibrations should be applied to the IC socket for an IC package during the loading operation of the IC package onto the IC socket, the IC package would be vibrated. Due to the foregoing vibrations, the contacts and the terminal members are dissociated and laterally displaced, thereby resulting in poor contact and decreased reliability.

SUMMARY OF THE INVENTION

It is therefore an object of the present invention to provide an IC socket capable of absorbing vibrations of an IC package loaded on the socket.

Another object of the invention is to provide an IC socket in which dissociation and lateral displacement of terminal members of an IC package relative to contacts of the socket can be prevented.

A further object of the invention is to provide an IC socket in which reliable contact can be obtained.

To achieve the above objects, according to the present invention, there is provided an IC socket having a plurality of contacts arranged so as to be subjected to pressing contact with terminal members of a IC package loaded on an IC loading portion. The improvement comprising an elastic sheet, whose base material itself has compressibility and restorability, disposed on the IC loading portion, the IC package loaded on the IC loading portion being supported on the elastic sheet.

DETAILED DESCRIPTION OF THE EMBODIMENT

Several embodiments of the present invention will be described in detail with reference to FIGS. 1 through 8, inclusive.

Figure 1:
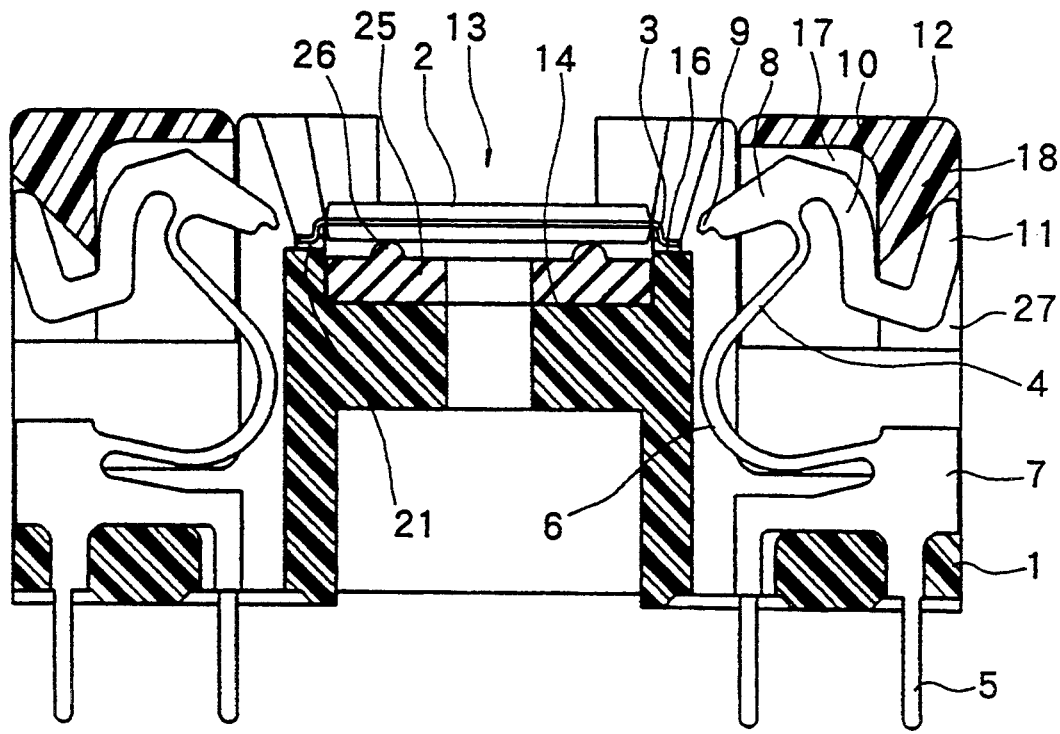
FIG. 1 is a cross-sectional view showing a contact released state of an IC socket according to one embodiment of the present invention.
Figure 2:
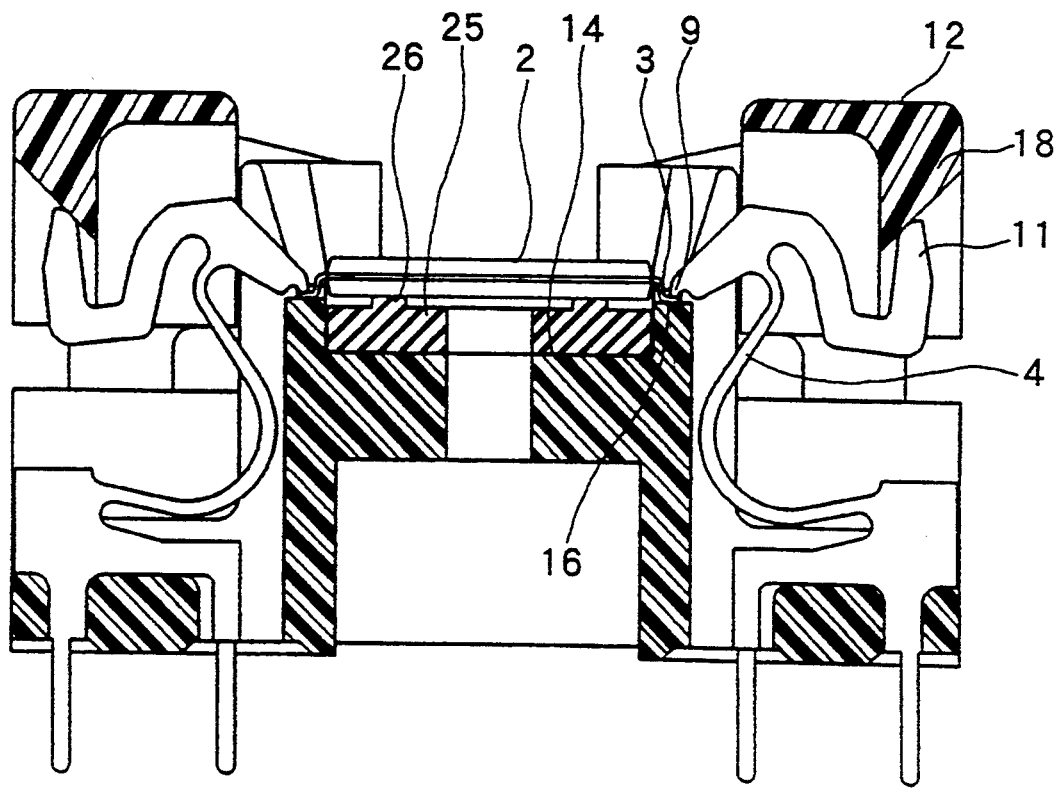
FIG. 2 is a cross-sectional view showing a state of contact of the IC socket of FIG. 1.

As shown in FIGS. 1 and 2, a socket body 1 has an IC loading portion 14 formed in a central portion of an upper surface thereof, a terminal support seat 16 for supporting lower surfaces of a number of terminal members 3 of an IC package 2 loaded on the IC loading portion 14, and a number of contacts 4 arranged in such a manner as to be brought into pressing contact with upper surfaces of the terminal members 3 supported on the terminal support seat 16.

The terminal members 3 of the IC package 2 are projected sideways from two opposite side surfaces thereof in parallel relation and bent into two steps at generally horizontal tips thereof.

Each contact 4 has a male-terminal 5 extending downwardly of a stationary end 7 implanted in the socket body 1 and projected downwardly of the socket body 1, and also a curved spring element 6 continuous to an upper part of the stationary end 7. The curved spring element 6 projects forwardly (toward the IC package 2 side), and a contacting piece portion 8 is continuous to an upper end of the curved spring portion 6. The contacting piece portion 8 projects toward the projecting side (forward) of the curved spring element 6, and is provided at a foremost end thereof with a contacting projection 9 projecting downward.

A cantilevered arm 10 extends rearwardly (or outwardly) from an upper end of the contact 4, i.e., from the contacting piece portion 8. The cantilevered arm 10 is connected at one end thereof to the contacting piece portion 8. The other end of the arm 10 serves as a free end. This free end portion is formed with a pressure receiving portion 11 which is opened and closed by a contact shutter member as will be described later. The pressure receiving portion 11 is formed of a projection piece projecting upwardly.

The contact shutter member 12 has an IC receiving window 13 formed in a central portion, and the IC loading portion 14 of the socket body 1 is formed right under the IC receiving window 13. The IC package 2 having the terminal members 3 which are each bent into two steps is known per se. The terminal member 3 includes a basal portion projecting generally horizontally sideways from the IC package body, an intermediate portion bent downwardly from the basal portion, and a foremost end portion horizontally bent from the intermediate portion. The lower surface of the foremost end portion of the terminal member 3 is supported by the terminal support seat 16.

The contacts 4 are arranged in array along opposite sides of the IC loading portion 14, and the contacting piece portion 8 of the contact 4 is received in an opening portion 17 formed outwardly of the terminal support seat 16 and is held in a state where the contacting projection 9 is in abutment with the upper surface of the terminal support seat 16 with stored resilient force, i.e., in a preloaded state.

The contact shutter member 12 is equipped at opposite outward positions of the IC receiving window 13 with a pair of press-down operation portions 18. The press-down operation portions 18 are arranged in opposite relation to each other on an upper end of the pressure-receiving portion 11 of the contact 4.

Specifically, when a pressing force is applied to the pressure receiving portion 11 by pressing down the contact shutter member 12, the contacting piece portion 8 is rearwardly (or outwardly) and obliquely upwardly displaced while displacing the curved spring element 6 against resiliency, so that the contacting piece portion 8 is positively moved away from the terminal member 3. In the foregoing condition, the IC package 2 is loaded on the IC loading portion through the IC receiving window 13.

When the press-down force applied to the contact shutter member 12 is released, the contacting piece portion 8 is displaced forwardly by a restoring force of the spring element 6, so that the contacting projection 9 is brought into press contact with the upper surface of the terminal member 3 to exert a downward force thereto.

In the socket body 1, an elastic sheet 25, which is composed of rubber, synthetic resin, a foam body or the like and whose base material itself has compressibility and restorability, is laid at the IC loading portion 14, and a plurality of projections 26, which are composed of the same base material, are formed on the upper surface of the elastic sheet 25, so that the lower surface of the body of the IC package 2 is supported by the projections 26 when the IC package 2 has been loaded on the IC loading portion 14. As shown in FIG. 1, by supporting the IC package 2 on the projections 26, the terminal member 3 is held above and opposite to the terminal support surface 16 with a gap 21 formed therebetween. In that condition, the contacting piece portion 8 of the contact 4 is forwardly (or inwardly) and upwardly displaced by the resilient restoring force of the spring element 6, so that the projection 9 is brought into pressing contact with the upper surface of the terminal member 3 of the IC package 3 to exert a downward force thereto. As shown in FIG. 2, this press-contact causes the terminal member 3 to be pressed down so that the terminal member 3 is supported on the support surface 16. At the same time, the IC package 2 is moved downwardly to compress the projections 26 between the IC package 2 and the IC loading portion 14. This compression creates an elastic restoring force in the projections 26, thereby causing an upwardly-directed force to be exerted against the IC package 2 so that the IC package 2 is elastically held between the projections 26 and contacting projections 9.

Figure 3:
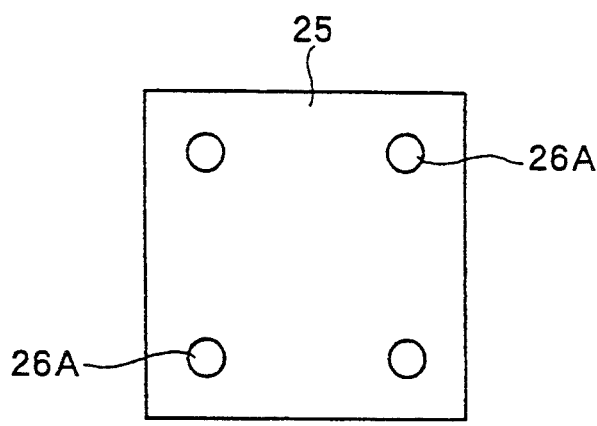
FIG. 3 is a plan view of an elastic sheet in the above embodiment.
Figure 4:
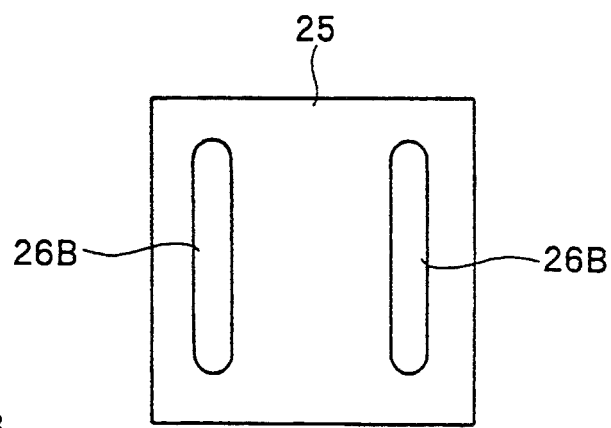
FIG. 4 is a plan view but showing another example of the elastic sheet.

As shown in FIG. 3, the projections 26 are comprised of spot-like projections 26A arranged at several spots on the upper surface of the elastic sheet 25 and having substantially circular horizontal cross sections. Alternatively, as shown in FIG. 4, the projections 26 are comprised of a plurality of ribs 26B linearly arranged on the upper surface of the elastic sheet 25, so that the IC package 2 would be supported in a horizontally well-balanced manner.

Referring back to FIG. 1, in the lowered position of the contact shutter member 12, the contacting piece portion 8 is moved sufficiently away from the IC package 2 so as not to interfere. In that condition, the IC package 2 can be loaded onto the elastic sheet 25 of the IC loading portions 14 through the IC receiving portion 13, and the foremost end portion of the terminal members 3, which have been bent into two steps, are held in opposition to the terminal support seat 16 across a gap 21. Then, when the press-down force applied to the press-down operation portion 18 of the contact shutter member 12 is released, as shown in FIG. 2, the contact shutter member 12 is lifted upwardly a predetermined amount by the restoring forces of the curved spring element 6 of the contacts 4 via the cantilevered arm 10 so as to be placed in a standby state awaiting the next press-down operation. This restoration causes the contacting piece portion 8 of the contact 4 to be displaced forwardly and upwardly, so that the contacting projection 9 presses down against the upper surface of the foremost end portion of the terminal member 3 obliquely from above. By doing this, the IC package 2 compresses the projections 26 of the elastic sheet 25 and in the meantime, the lower surfaces of the foremost end portion of the terminal members 3 are supported on the terminal support seat 16, whereby the contacting projection 9 of the contacts 4 are brought into pressing contact with the upper surfaces of the foremost end portions of the terminal members 3 with a predetermined contacting pressure in order to exert a press-down force thereto. At this time, an upwardly directing resilient force is exerted to the IC package 2 due to the compression of the elastic sheet 25.

As a result, the IC package 2 is retained by the socket body 1 by being elastically held between the projections 9 of the elastically deformable contacts 4 and the elastically deformable projections 26 of the sheet 25, and also clamped between the terminal support seat 16 and the contacting projections 9 of the contacting piece portions 8. In this holding condition, the elastic sheet 25 and the contacts 4 absorb the vibrations acting on the IC package 2 from the socket body 1, and dissociation and lateral displacement of the contacting projections 9 relative to the terminal members 3 caused by the vibrations are prevented, so that stable contact is assured between the contacting projections 9 and the terminal members 3.

When the press-down operation portion 18 of the contact shutter member 12 is pressed down again, the contacts 4 are displaced rearwardly and downward in the same manner as previously described, in order to release the contact with the IC package 2 and place the contacts 4 in a non-interference condition. In this condition, the IC package 2 can be loaded and unloaded.

The press-down operation of the contact shutter member 12 can be carried out by the simplest vertical motion of a manipulator of a robot.

In the above embodiment, the contacts 4 are arranged in array along a pair of opposite sides of the IC loading portion 14 of the socket body 1. However, the present invention is likewise applicable to a case wherein the contacts 4 are arranged in array along two pairs of opposite sides of the IC loading portion of the socket body. In this case, the press-down operation portions 18 of the contact shutter member 12 may be disposed at two pairs of opposite sides of the IC receiving window 13 so as correspond to the foregoing arrangement.

Other embodiments of the present invention will now be described with reference to FIGS. 5 through 8.

Figure 5:
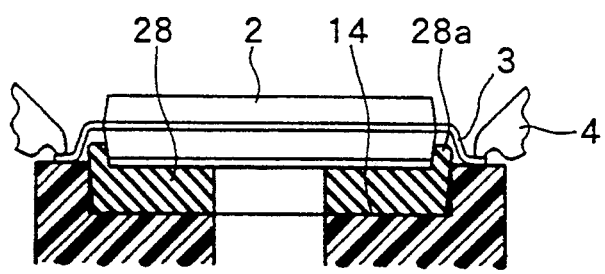
FIG. 5 is a cross-sectional view showing a state of contact of a socket according to another embodiment of the present invention.

In the embodiment of FIG. 5, an elastic sheet 28 composed of rubber, synthetic resin, a foam body, or the like is disposed on the IC loading portion 14. The peripheral edges of the elastic sheet 28 are allowed to project upwardly along the side surfaces of the IC loading portion 14 and the IC package 2, so that when the contacts 4 are brought into pressing contact with the terminal members 3 of the IC package 2, the IC package 2 presses against the peripheral projection portion 28a of the elastic sheet 28 to resiliently hold the IC package 2, and the peripheral projection 28a of the elastic sheet 28 restricts the side surface of the IC package.

Figure 6:
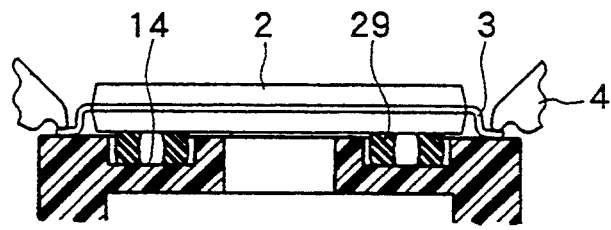
FIG. 6 is a cross-sectional view showing a state of contact according to still another embodiment of the present invention.

In the embodiment of FIG. 6, a plurality of elastic sheets 29 of a hollow structure (for example, sleeve-like sheets) composed of rubber, synthetic resin, a foam body, or the like are arranged on the IC loading portion 14, so that when the contacts 4 is brought into pressing contact with the terminal members 3 of the IC package 2, the IC package 2 compresses and deforms the elastic sheets 29 so that the IC package 2 is elastically held by the elastic sheets 29. The hollow elastic sheets 29 may be ring-shaped elastic sheets. In that case, the ring-shaped elastic sheets 29 are laid on the IC loading portion 14 in order to annularly support the lower surface of the IC package 2.

Figure 7:
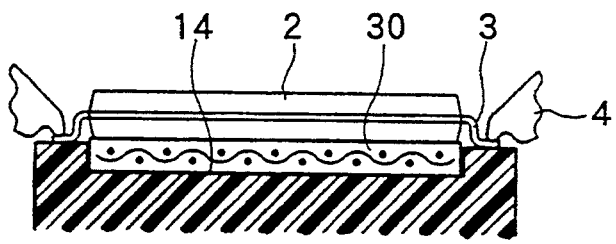
FIG. 7 is a cross-sectional view showing a state of contact according to yet another embodiment of the present invention.

In the embodiment of FIG. 7, an elastic sheet 30 is composed of a non-woven fabric or woven fabric, and such composed elastic sheet 30 is laid on the IC loading portion 14.

Figure 8:
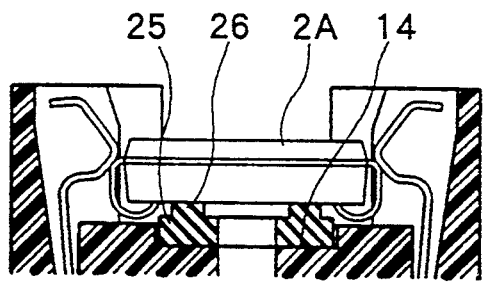
FIG. 8 is a cross-sectional view showing a state of contact of an socket according to still another embodiment of the present invention, which is now in contact with a J-bend type IC package.

In the embodiment of FIG. 8, the elastic sheet 25 provided with the projections 26 is laid on the IC loading portion 14 of the IC socket on which an IC package 2A including J-bend type terminal members 3 can be mounted, and the contacts 4 are brought into pressing contact with the terminal members 3 in such a manner as to exert a downwardly directing force thereto, so that the IC package 2A is elastically held between the elastic sheet 25 and the contacts 4.

In the above-mentioned embodiments, although the contacts 4 are brought into contact with only the upper surfaces of the terminal members 3 (upper surface contact type), the present invention is likewise applicable to IC sockets in which the contacts 4 are brought into contact with the side surfaces or the lower surface of the terminal members 3. The present invention is not limited to the example in which the elastic sheet 29 is compressed by the resilient force of the contacts 4. The invention includes a case wherein the body or terminal members 3 of the IC package 2 is pressed down by other pressing means such as presser cover.

As described in the foregoing, according to the present invention, the IC package is loaded on the elastic sheet laid on the IC loading portion, and the contacts are brought into pressing contact with the terminal members of the IC package to cause the IC package to compress the elastic sheet, so that the IC package is elastically held by a reaction generated by this compression. Accordingly, the elastic sheet can favorably absorbs vibrations transmitted from the socket toward the IC package side, and as a result, dissociation and lateral displacement, which are caused by the vibrations, of the terminal member of an IC package relative to the contact of the socket can be prevented, thereby improving reliability of contact.

What is claimed is:

1. An IC package receiving apparatus comprising:
   a main body having an IC loading portion, and a terminal support seat adjacent a periphery of said IC loading portion;
   an elastic sheet mounted on said IC loading portion, said elastic sheet having a plurality of elastic projections projecting upwardly therefrom for supporting a body of an IC package in a non-contact position in which horizontally extending terminals of the IC package are spaced above and confronting said terminal support seat; and
   a plurality of resilient contacts secured to said main body for resiliently pressing down against upper surfaces of the terminals to press the terminals against said terminal support seat so as to simultaneously clamp the terminals between said contacts and said support seat and press the body of the IC package against said elastic projections so as to compress said projections and create an elastic restoring force in said projections, to thereby elastically support the IC package in a contact position between said elastic projections and said resilient contacts.

2. An IC package receiving apparatus as recited in claim 1, wherein
   each of said projections is substantially circular in horizontal cross section.

3. An IC package receiving apparatus as recited in claim 1, wherein
   each of said projections comprises a horizontally elongated rib.

* * * * *